(12) United States Patent
Darabi

(10) Patent No.: US 7,013,117 B2
(45) Date of Patent: Mar. 14, 2006

(54) ANALOG POWER DETECTION FOR GAIN CONTROL OPERATIONS

(75) Inventor: Hooman Darabi, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 601 days.

(21) Appl. No.: 10/138,605

(22) Filed: May 3, 2002

(65) Prior Publication Data
US 2003/0181179 A1    Sep. 25, 2003

Related U.S. Application Data

(60) Provisional application No. 60/367,904, filed on Mar. 25, 2002.

(51) Int. Cl.
H04B 1/16 (2006.01)

(52) U.S. Cl. .................. 455/240.1; 455/263; 375/345; 330/253

(58) Field of Classification Search .. 455/226.1–226.2, 455/232.1, 234.1, 240.1, 245.1, 247.1, 250.1, 455/252.1, 263, 293, 309; 330/253, 257, 330/277, 288; 327/58, 59, 62, 357; 375/345
See application file for complete search history.

(56) References Cited

U.S. PATENT DOCUMENTS

| | | | | |
|---|---|---|---|---|
| 5,448,774 A | * | 9/1995 | Yokozaki et al. | ........ 455/343.5 |
| 5,737,361 A | * | 4/1998 | Park et al. | .................. 375/149 |
| 6,127,884 A | * | 10/2000 | Rishi | .......................... 329/304 |
| 6,449,245 B1 | * | 9/2002 | Ikeda et al. | ................. 370/208 |
| 6,459,721 B1 | * | 10/2002 | Mochizuki et al. | ......... 375/130 |
| 6,459,889 B1 | * | 10/2002 | Ruelke | ....................... 455/296 |
| 6,510,188 B1 | * | 1/2003 | Isaksen et al. | .............. 375/345 |

* cited by examiner

Primary Examiner—Nguyen T. Vo
Assistant Examiner—Nhan T. Le
(74) Attorney, Agent, or Firm—Garlick Harrison & Markison, LLP; James A. Harrison

(57) ABSTRACT

A method and apparatus for dynamically controlling a programmable gain amplifier (PGA) in a radio receiver to provide a plurality of gain steps thereby providing automatic gain control (AGC) in a receiver intermediate frequency (IF) stage comprises an analogy peak detector formed to including a constant current source and a plurality of MOSFETs all configured to produce an output voltage (DC) whose value reflects a peak amplitude of a received differential quadrature phase shift keyed (QPSK) signal. A first circuit portion generates currents that are proportional to the square of the magnitude of the gate to source voltage for each of a plurality of MOSFETs coupled to receive the differential QPSK signal and a second circuit portion produces a voltage that is equal to the square root of the sum of the squares of the currents produced (drawn) by the MOSFETs of the first circuit portion.

20 Claims, 10 Drawing Sheets

ANALOG POWER DETECTION FOR GAIN CONTROL OPERATIONS

CROSS-REFERENCE TO RELATED APPLICATION

This application claims priority to and incorporates by reference U.S. Provisional Application entitled, "Method and Apparatus for a Radio Transceiver", having a Ser. No. of 60/367,904 and a filing date of Mar. 25, 2002.

BACKGROUND

1. Field of the Invention

This invention relates generally to wireless communications and, more particularly, to the operation of a Radio Frequency (RF) transceiver within a component of a wireless communication system.

2. Description of the Related Art

The structure and operation of wireless communication systems are generally known. Examples of such wireless communication systems include cellular systems and wireless local area networks, among others. Equipment that is deployed in these communication systems is typically built to support standardized operations, i.e., operating standards. These operating standards prescribe particular carrier frequencies, modulation types, baud rates, physical layer frame structures, MAC layer operations, link layer operations, etc. By complying with these operating standards, equipment interoperability is achieved.

In a cellular system, a regulatory body typically licenses a frequency spectrum for a corresponding geographic area (service area) that is used by a licensed system operator to provide wireless service within the service area. Based upon the licensed spectrum and the operating standards employed for the service area, the system operator deploys a plurality of carrier frequencies (channels) within the frequency spectrum that support the subscriber units within the service area. Typically, these channels are equally spaced across the licensed spectrum. The separation between adjacent carriers is defined by the operating standards and is selected to maximize the capacity supported within the licensed spectrum without excessive interference. In most cases, severe limitations are placed upon the amount of adjacent channel interference that maybe caused by transmissions on a particular channel.

In cellular systems, a plurality of base stations is distributed across the service area. Each base station services wireless communications within a respective cell. Each cell may be further subdivided into a plurality of sectors. In many cellular systems, e.g., Global System for Mobile Communications (GSM) cellular systems, each base station supports forward link communications (from the base station to subscriber units) on a first set of carrier frequencies, and reverse link communications (from subscriber units to the base station) on a second set of carrier frequencies. The first set and second set of carrier frequencies supported by the base station are a subset of all of the carriers within the licensed frequency spectrum. In most, if not all, cellular systems, carrier frequencies are reused so that interference between base stations using the same carrier frequencies is minimized and system capacity is increased. Typically, base stations using the same carrier frequencies are geographically separated so that minimal interference results.

Both base stations and subscriber units include RF transceivers. Radio frequency transceivers service the wireless links between the base stations and subscriber units. The RF transmitter receives a baseband signal from a baseband processor, converts the baseband signal to an RF signal, and couples the RF signal to an antenna for transmission. In most RF transmitters, because of well-known limitations, the baseband signal is first converted to an Intermediate Frequency (IF) signal and then the IF signal is converted to the RF signal. Similarly, the RF receiver receives an RF signal, down converts the RF signal to an IF signal and then converts the IF signal to a baseband signal. In other systems, the received RF signal is converted directly to a baseband signal.

In the initial signal processing stages of an RF receiver, the received RF signal is converted to baseband through one or more steps. Initially, the received RF is mixed with a local oscillator (LO) to down convert the carrier frequency of the RF. It is also common to utilize a low pass filter coupled to the output of the mixer to remove introduced interferences. One problem with using a mixer and low pass filter, however, is that both add a fixed amount of gain to the received signal, irrespective of the received signal strength.

This amplified signal is passed to the baseband processor, which is sensitive to excessive signal strength which can cause quantification errors in downstream analog-to-digital converters (ADCs) and saturation in the output devices. Previous designs have included a programmable gain amplifier (PGA) between the low pass filter output and the baseband processor input to limit the gain when the received signal strength is excessive. This approach, however, requires a method to detect the peak amplitude of the received signal then provide a control signal to the PGA that is proportional to the received signal amplitude.

Since a received signal is comprised of a differential I and Q signal, the traditional method of detecting the peak amplitude is to take the square root of the sum of I squared and Q squared $[(I^2+Q^2)^{1/2}]$. The square root function is traditionally performed using a digital signal processor (DSP) in the digital domain. Generally, though, it is advantageous to perform such peak amplitude detection in the analog domain and to perform gain control based upon the detected peak values. There is a need in the art, therefore, for an analog circuit and a method to adjust the gain level of the PGA according to the determined peak amplitude of the amplified signal.

SUMMARY OF THE INVENTION

The present invention provides a method and apparatus for dynamically controlling a programmable gain amplifier (PGA) to provide a plurality of gain steps thereby providing automatic gain control (AGC) in a receiver intermediate frequency (IF) stage. The signal output of the PGA can, therefore, be automatically controlled to an acceptable (regulated) amplitude level for input into a baseband processor without danger of either saturating the output stages of the baseband processor or compromising dynamic range.

Generally the output signal level of the PGA is provided to the input of a peak amplitude detector that outputs a signal level proportional to the peak amplitude of the received signal. The detected peak signal level is coupled to the first input of a pair of comparators each of which have a reference level provided to the second input. The output of the first comparator is provided to the UP input terminal of a 4-bit counter whereas the output of the second comparator is provided to the DOWN input terminal. In conjunction with an external clock signal, the four bit counter either increments or decrements the 4-bit binary output value based on the levels at the UP and DOWN inputs. The 4-bit binary value is coupled to the gain control inputs of PGAs thereby increasing or decreasing the PGA gain as necessary to maintain the required output level.

The gain control inputs of the PGAs are used as control lines for setting the gain in a plurality of coarse gain amplifiers and fine gain amplifiers. In one embodiment of the invention, three coarse amplifiers are provided each having a gain of either 0 dB or 12 dB based on the value of a two state signal provided to each amplifier gain control input. A single fine gain amplifier has a gain of 0 dB, 3 dB, 6 dB or 9 dB based on the binary value of the four state signal provided to each amplifier. The combination of three coarse gain amplifiers and one fine gain amplifier provides for a total gain of 45 dB in 3 dB steps in the described embodiment of the invention. The PGAs comprises a succession of operational amplifiers wherein at least one is for providing fine gain control and wherein the gain of each fine gain amplifier is controlled by the resistance ratios of a plurality of selectively biased Metal Oxide Semiconductor Field Effect Transistors (MOSFETs) coupled at an input stage and in a feedback loop between the inputs and outputs of each amplifier.

Each of the amplifiers is coupled to receive control signals, as disclosed herein, specifying a gain level. The determination whether to increase or decrease the gain is made in part by comparing a peak amplitude of the received and amplified RF signal to a set of upper and lower thresholds. The present invention is particularly advantageous in that the peak amplitude is determined by analog CMOS amplification circuitry whose output generally is represented by the equation of the square root of the sum of the squares of the I and Q signal amplitudes. To achieve this fast analog based output, an amplifier takes advantage of the square law response of a MOSFET transistor, when operating in the saturation region, to provide a voltage output that is proportional to the peak amplitude of the received signal More specifically, the received signal I and Q components each have a frequency, $\omega_0$, with an amplitude "a". The phase of the I and Q components are separated by 90 degrees so the signals may be represented by the sine and cosine function (a)sin $\omega_0 t$ and (a)cos $\omega_0 t$. The differential I and Q signals therefore provide four signals available for processing.

The four signals are then presented to the gate terminals of a first plurality of matched MOSFETs connected in parallel and biased in the saturation region. In the saturation region the drain current of a MOSFET is defined by the equation $I=\frac{1}{2}\beta(V_{GS}-V_t)^2$, where $\beta$ and $V_t$ are constants determined by device geometry and manufacturing process and $V_{GS}$ is the voltage across the gate and source terminals. This region is know as the square law region since the drain current is proportional to the square of the gate to source voltage. The voltages presented to the gates of the MOSFETS can be defined to be v1, v2, v3 and v4 where v1=$V_{BIAS}$+(a)sin $\omega_0 t$, v2=$V_{BIAS}$-(a)sin $\omega_0 t$, v3=$V_{BIAS}$+(a)cos $\omega_0 t$, and v4=$V_{BIAS}$-(a)cos $\omega_0 t$.

The four drain currents will be i1=$\frac{1}{2}\beta$(v1-$V_t$)$^2$=$\frac{1}{2}\beta$($V_{BIAS}$+(a)sin $\omega_0 t$-$V_t$)$^2$, i2=$\frac{1}{2}\beta$(v2-$V_t$)$^2$=$\frac{1}{2}\beta$($V_{BIAS}$-(a)sin $\omega_0 t$-$V_t$)$^2$, i3=$\frac{1}{2}\beta$(v3-$V_t$)$^2$=$\frac{1}{2}\beta$($V_{BIAS}$+(a)cos $\omega_0 t$-$V_t$)$^2$ and i4=$\frac{1}{2}\beta$(v4-$V_t$)$^2$=$\frac{1}{2}\beta$($V_{BIAS}$-(a)cos $\omega_0 t$-$V_t$)$^2$. The total drain current is the sum of the four currents i1, i2, i3 and i4. After completing the squares and noting that (Sin$^2$+Cos$^2$)=1, it can be shown that the total current I=$2\beta(V_{BIAS}-V_t)^2+\frac{1}{2}\beta(2a^2)$ where the first term $2\beta(V_{BIAS}-V_t)^2$ is a constant that can be represented by a DC current, $I_{DC}$, therefore the total current I, is I=$I_{DC}+\beta a^2$.

The drain terminals of the first plurality of MOSFETs are couple to an output node which is further connected to the output of a first current source and to the source terminals of a second plurality of MOSFETs connected in parallel with the first current source. Additionally, the second plurality of MOSFETs is formed so that the gate terminals are connected to the drain terminals. The first current source is formed to provide a current equal to $I_{DC}$ while the second plurality of MOSFETs is formed to output a current equal to $\beta a^2$. In one embodiment of the invention, the second plurality of MOS-FETs is comprised of two MOSFETs therefore the drain current of each MOSFET is equal to $\frac{1}{2}$ of $\beta a^2$ which is also equal to $\frac{1}{2}\beta(V_{GS}-V_t)^2$ (the drain current equation of a MOSFET). Because the drain terminals of the second plurality of MOSFETs are connected to the supply voltage $V_{DD}$ and the source terminal is connected to the output node, the gate to source voltage is equal to $V_{DD}$-Vout. The drain current is, therefore, equal to $\frac{1}{2}\beta(V_{DD}-V_{out}-V_t)^2$ that is also equal to $\frac{1}{2}\beta a^2$. It can be seen that $V_{out}$ is equal to ($V_{dd}-V_t$) -a. As previously discussed, $V_t$ is a constant which is dependent on device geometry so the output voltage is equal to a constant ($V_{DD}-V_t$) minus the peak amplitude of the received signal.

A result of the above is an analog signal that reflects a peak amplitude of a received signal that is fast, consumes little power, and facilitates fast gain control to provide a constant gain level to baseband processing circuitry. Other features and advantages of the present invention will become apparent from the following detailed description of the invention made with reference to the accompanying drawings.

BRIEF DESCRIPTION OF THE DRAWINGS

These and other features, aspects and advantages of the present invention will be more fully understood when considered with respect to the following detailed description, appended claims and accompanying drawings wherein:

DETAILED DESCRIPTION OF THE DRAWINGS

Figure 1A:
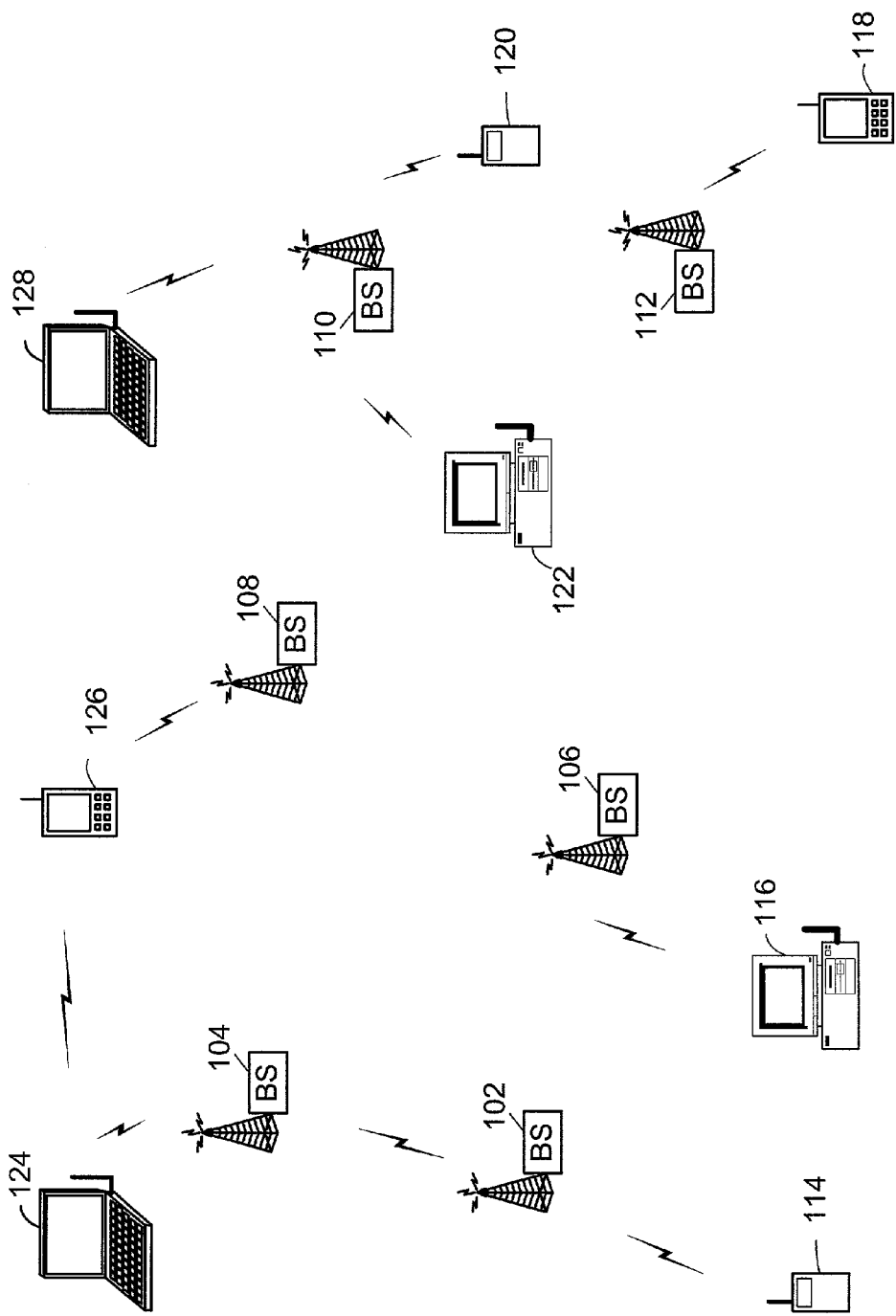
FIG. 1A is a system diagram illustrating a cellular system within which the present invention is deployed.

FIG. 1A is a system diagram illustrating a cellular system within which the present invention is deployed. The cellular system includes a plurality of base stations 102, 104, 106, 108, 110, and 112 that service wireless communications within respective cells, or sectors. The cellular system services wireless communications for a plurality of wireless subscriber units. These wireless subscriber units include wireless handsets 114, 118, 120, and 126, mobile computers 124 and 128, and desktop computers 116 and 122. During normal operations, each of these subscriber units communicates with one or more base stations during handoff among the base stations 102 through 112. Each of the subscriber units 114 through 128 and base stations 102 through 112 include RF circuitry constructed according to the present invention.

The RF circuitry formed according to the present invention may be formed to operate with any one of a number of different protocols and networks. For example, the network of FIG. 1A may be formed to be compatible with Bluetooth wireless technology that allows users to make effortless, wireless and instant connections between various communication devices such as notebook computers, desktop computers and mobile phones. Because Bluetooth systems use radio frequency transmissions to transfer both voice and data, the transmissions occur in real-time.

The Bluetooth specification provides for a sophisticated transmission mode that ensures protection from interference and provides security of the communication signals. According to most designs that implement the Bluetooth specifications, the Bluetooth radio is being built into a small microchip and is designed to operate in frequency bands that are globally available. This ensures communication compatibility on a worldwide basis. Additionally, the Bluetooth specification defines two power levels.

A first power level covers the shorter, personal area within a room and a second power level is designed for covering a medium range. For example, the second power level might be used to cover communications from one end of a building, such as a house, to the other. Software controls and identity coding are built into each microchip to ensure that only those units preset by the owners can communicate with each other. In general, it is advantageous to utilize low power transmissions and components that draw low amounts of power (especially for battery operated devices). The Bluetooth core protocols include Bluetooth-specific protocols that have been developed for Bluetooth systems. For example, the RFCOMM and TCS binary protocols have also been developed for Bluetooth but they are based on the ETSI TS 07.10 and the ITU-T recommendations Q.931 standards, respectively. Most Bluetooth devices require the Bluetooth core protocols, in addition to the Bluetooth radio, while the remaining protocols are only implemented when necessary.

The baseband and link control layers facilitate the physical operation of the Bluetooth transceiver and, more specifically, the physical RF link between Bluetooth units forming a network. As the Bluetooth standards provide for frequency-hopping in a spread spectrum environment in which packets are transmitted in continuously changing defined time slots on defined frequencies, the baseband and link control layer utilizes inquiry and paging procedures to synchronize the transmission of communication signals at the specified frequency and clock cycles between the various Bluetooth devices.

The Bluetooth core protocols further provide two different types of physical links with corresponding baseband packets. A synchronous connection-oriented (SCO) physical link and an asynchronous connectionless (ACL) physical link may be implemented in a multiplexed manner on the same RF link. ACL packets are used for data only while the SCO packets may contain audio, as well as a combination of audio and data. All audio and data packets can be provided with different levels of error correction and may also be encrypted if required. Special data types, including those for link management and control messages, are transmitted on a specified channel.

There are other protocols and types of networks being implemented and that may be used with the network of FIG. 1A. For example, wireless networks that comport with service premises-based Wireless Local Area Network (WLAN) communications, e.g., IEEE 802.11a and IEEE 802.11b communications, and ad-hoc peer-to-peer communications, e.g., Bluetooth (as described above). In a WLAN system, the structure would be similar to that shown in FIG. 1A, but, instead of base stations 102 through 112, the WLAN system would include a plurality of Wireless Access Points (WAPs). Each of these WAPs would service a corresponding area within the serviced premises and would wirelessly communicate with serviced wireless devices. For peer-to-peer communications, such as those serviced in Bluetooth applications, the RF transceiver of the present invention would support communications between peer devices, e.g., mobile computer 124 and wireless handset device 126. The fast growth of the mobile communications market and for networks as shown in FIG. 1A require the development of multi-band RF transceivers that are small in size, low in cost, and have low power consumption. These RF transceivers should be suitable for a high level of system integration on a single chip for reduced cost and miniaturized mobile device size. Low power consumption is very critical for increasing mobile device battery life, especially for mobile devices that include small batteries.

Generally, Bluetooth facilitates the fabrication of a low-cost and low-power radio chip that includes some of these protocols described herein. The Bluetooth protocol operates in the unlicensed 2.4 GHz Industrial Scientific Medical (ISM) band and, more specifically, transmits and receives on 79 different hop frequencies at a frequency in the approximate range of 2400 to 2480 MHz, switching between one hop frequency to another in a pseudo-random sequence. Bluetooth, in particular, uses Gaussian Phase Shift Keyed (GFSK) modulation. Its maximum data rate is approximately 721 kbits/s and the maximum range is up to 20–30 meters.

Even though Bluetooth has a much lower range and throughput than other known systems, its consequently significantly reduced power consumption means it has the ability to be much more ubiquitous. It can be placed in printers, keyboards, and other peripheral devices, to replace short-range cables. It can also be placed in pagers, mobile phones, and temperature sensors to allow information download, monitoring and other devices equipped with a Bluetooth access point. Nonetheless, it is advantageous to improve the low power consumption of Bluetooth devices to improve battery life for portable applications.

Similarly, wireless LAN technologies (such as those formed to be compatible with IEEE 802.11b) are being designed to complement and/or replace the existing fixed-connection LANs. One reason for this is that the fixed connection LANs cannot always be implemented easily. For example, installing wire in historic buildings and old buildings with asbestos components makes the installation of LANs difficult. Moreover, the increasing mobility of the worker makes it difficult to implement hardwired systems. In response to these problems, the IEEE 802 Executive Committee established the 802.11 Working Group to create WLAN standards. The standards specify an operating frequency in the 2.4 GHz ISM band.

The first IEEE 802.11 WLAN standards provide for data rates of 1 and 2 Mbps. Subsequent standards have been designed to work with the existing 802.11 MAC layer (Medium Access Control), but at higher frequencies. IEEE 802.11a provides for a 5.2 GHz radio frequency while IEEE 802.11b provides for a 2.4 GHz radio frequency band (the same as Bluetooth). More specifically, the 802.11b protocol operates in the unlicensed 2.4 GHz ISM band. Data is transmitted on Binary Phase Shift Keyed (BPSK) and Quadrature Phase Shift Keyed (QPSK) constellations at 11 Mbps. 802.11b data rates include 11 Mbits/s, 5.5, 2 and 1 Mbits/s, depending on distance, noise and other factors. The range can be up to 100 m, depending on environmental conditions.

Because of the high throughput capability of 802.11b devices, a number of applications are more likely to be developed using 802.11b for networks such as that shown in FIG. 1A. These technologies will allow the user to connect to wired LANs in airports, shops, hotels, homes, and businesses in networks even though the user is not located at home or work. Once connected the user can access the Internet, send and receive email and, more generally, enjoy access to the same applications the user would attempt on a wired LAN. This shows the success in using wireless LANs to augment or even replace wired LANs.

The RF circuitry of the present invention is designed to satisfy at least some of the above mentioned standard-based protocols and may be formed in any of the subscriber units 114 through 128, base stations 102 through 112 or in any other wireless device, whether operating in a cellular system or not. The RF circuitry of the present invention includes low power designs that utilize CMOS technology and that support the defined protocols in a more efficient manner. Thus, for example, the teachings of the present invention may be applied to wireless local area networks, two-way radios, satellite communication devices, or other devices that support wireless communications. One challenge, however, with CMOS design in integrated circuits is that they typically utilize voltage sources having low values (e.g., 3 volts) and are generally noisy. It is a challenge, therefore, to develop receiver and transmitter circuitry that have full functionality while meeting these lower power constraints and while providing good signal quality. The system of FIGS. 1A and 1B include the inventive gain circuitry gain control disclosed herein to provide discrete gain steps to avoid over amplification and under amplification of a down converted signal prior to delivery to a baseband processor. More specifically, the receiver circuitry formed within the system of FIGS. 1A and 1B includes analog peak detection circuitry that allows for gain control circuitry to determine what gain adjustments should be made.

Figure 1B:
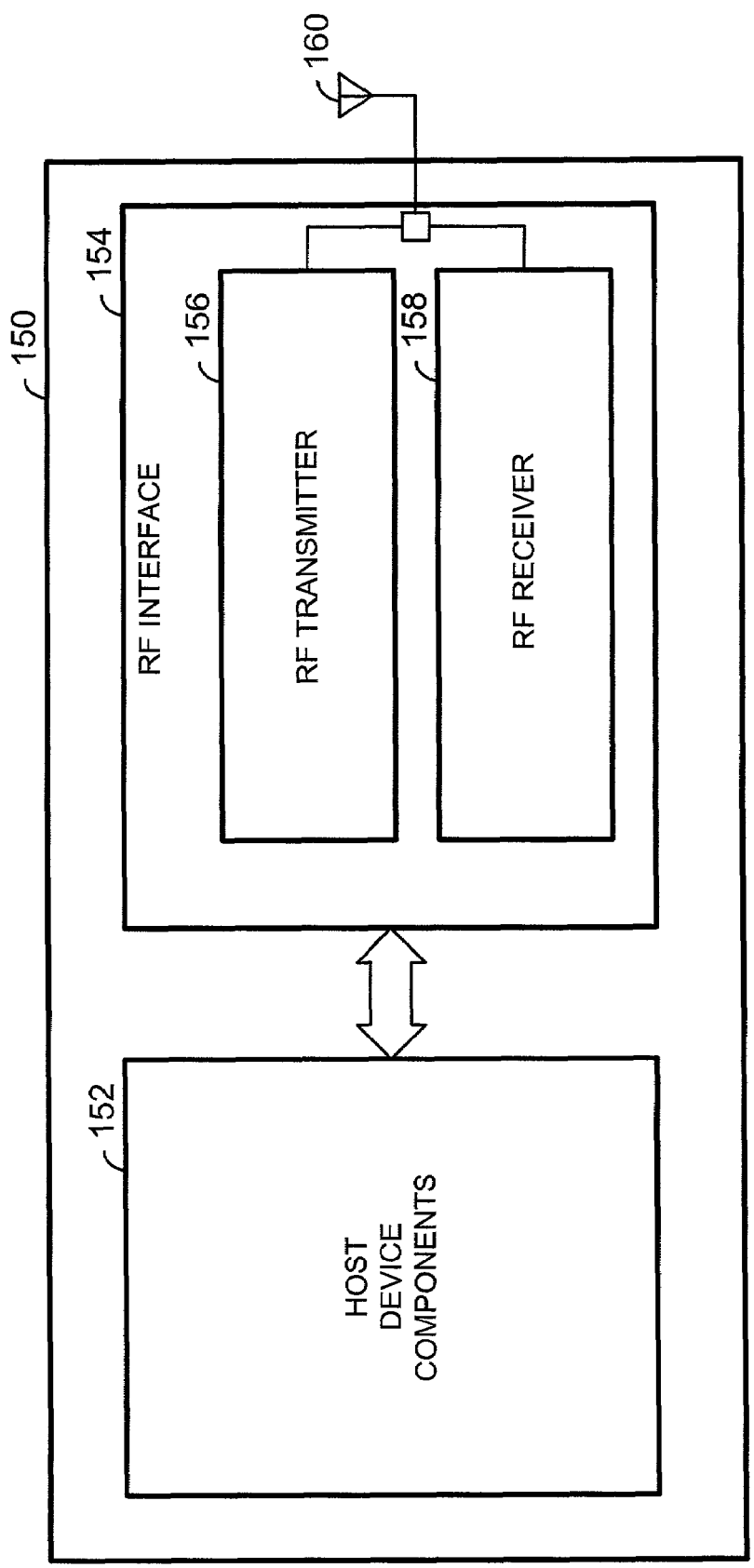
FIG. 1B is a block diagram generally illustrating the structure of a wireless device constructed according to the present invention.

FIG. 1B is a block diagram generally illustrating the structure of a wireless device 150 constructed according to the present invention. The general structure of wireless device 150 will be present in any of wireless devices 114 through 128 illustrated in FIG. 1A. Wireless device 150 includes a plurality of host device components 152 that service all requirements of wireless device 150 except for the RF requirements of wireless device 150. Of course, operations relating to the RF communications of wireless device 150 will be partially performed by host device components 152.

Coupled to host device components 152 is a Radio Frequency (RF) interface 154. RF interface 154 services the RF communications of wireless device 150 and includes an RF transmitter 156 and an RF receiver 158. RF transmitter 156 and RF receiver 158 both couple to an antenna 160. One particular structure of a wireless device is described with reference to FIG. 2. Further, the teachings of the present invention are embodied within RF transmitter 156 of RF interface 154.

The RF interface 154 may be constructed as a single integrated circuit. However, presently, the RF interface 158 includes an RF front end and a baseband processor. In the future, however, it is anticipated that many highly integrated circuits, e.g., processors, system on a chip, etc., will include an RF interface, such as the RF interface 154 illustrated in FIG. 1B. In such case, the receiver structure of the present invention described herein may be implemented in such devices. The RF receiver portion 158 includes the inventive analog peak detector or an alternate or equivalent embodiment of that which is disclosed herein.

Figure 2:
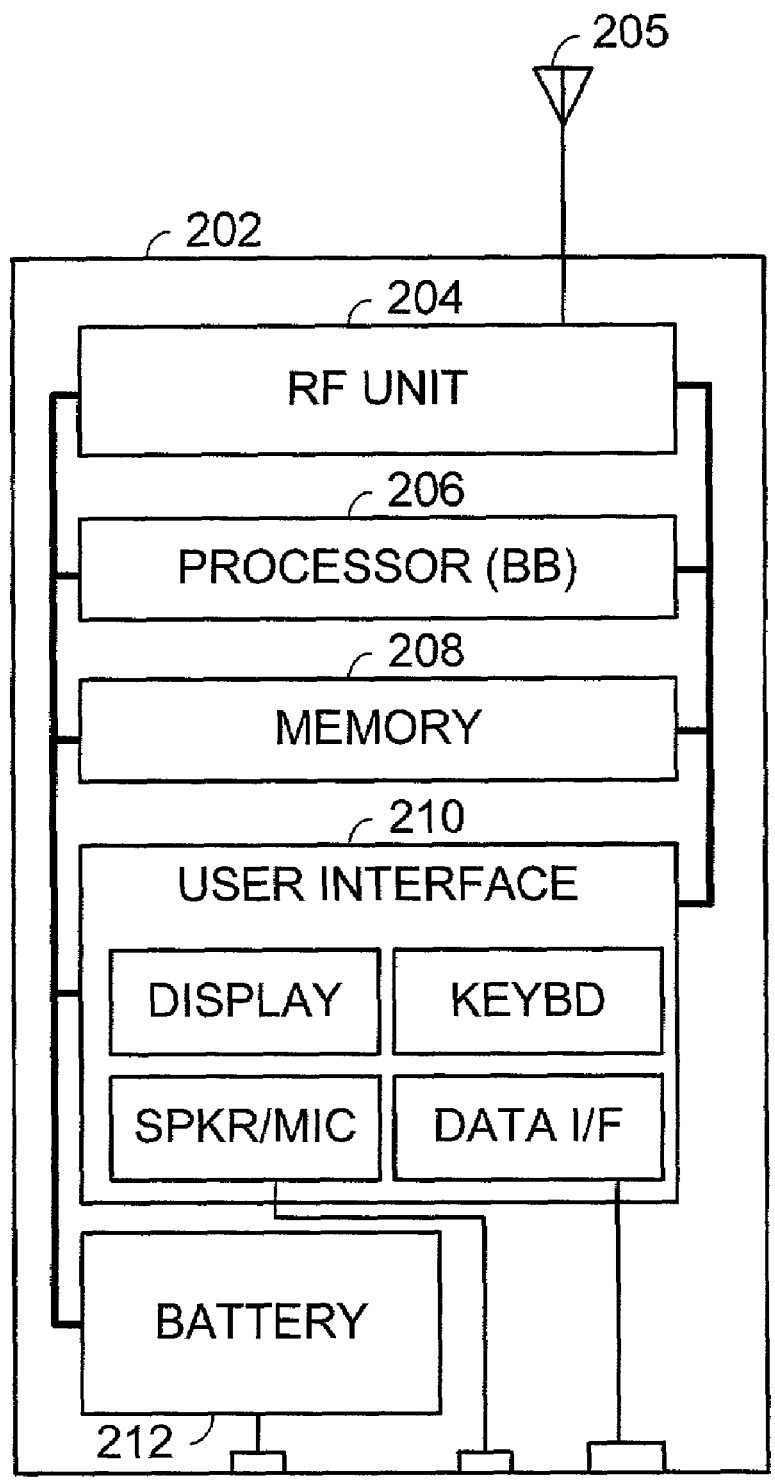
FIG. 2 is a block diagram illustrating a subscriber unit constructed according to the present invention.

FIG. 2 is a block diagram illustrating a subscriber unit 202 constructed according to the present invention. Subscriber unit 202 operates within a cellular system, such as the cellular system described with reference to FIG. 1A. Subscriber unit 202 includes an RF unit 204, a processor 206 that performs baseband processing and other processing operations, and a memory 208. RF unit 204 couples to an antenna 205 that may be located internal or external to the case of subscriber unit 202. Processor 206 may be an Application Specific Integrated Circuit (ASIC) or another type of processor that is capable of operating subscriber unit 202 according to the present invention. Memory 208 includes both static and dynamic components, e.g., Dynamic Random Access Memory (DRAM), Static Random Access Memory (SRAM), Read Only Memory (ROM), Electronically Erasable Programmable Read Only Memory (EEPROM), etc. In some embodiments, memory 208 may be partially or fully contained upon an ASIC that also includes processor 206. A user interface 210 includes a display, a keyboard, a speaker, a microphone, and a data interface, and may include other user interface components, as well. RF unit 204, processor 206, memory 208, and user interface 210 couple via one or more communication buses or links. A battery 212 is coupled to, and powers, RF unit 204, processor 206, memory 208, and user interface 210.

RF unit 204 includes the RF transceiver components and operates according to the present invention to adjust the amplification or gain level of a programmable gain amplifier prior to delivery of a down converted signal to a baseband processor. More specifically, RF unit 204 includes the gain control circuitry as described herein receives detected peak values from an analog peak detector and generates gain control commands responsive thereto. Further, the RF unit 204 provides circuitry that generates a received signal strength indication as a part of providing gain control commands thereby eliminating a need for a discrete received signal strength indicator circuit for determining the signal strength of a received and down converted RF signal. The structure of subscriber unit 202, as illustrated, is only one particular example of a subscriber unit structure. Many other varied subscriber unit structures could be operated according to the teachings of the present invention. Further, the principles of the present invention may be applied to base stations, as are generally described with reference to FIG. 1A. In general, however, RF unit 204 includes the inventive analog peak detector.

Figure 3:
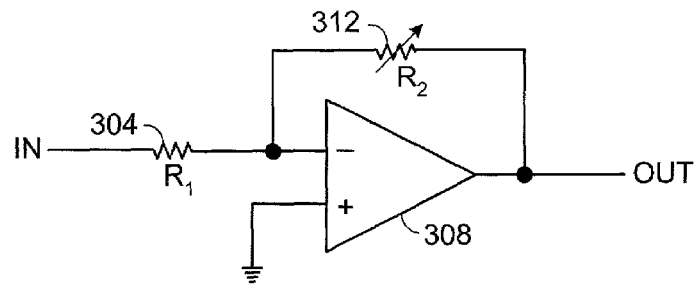
FIG. 3 is a functional schematic diagram of an amplifier system.

FIG. 3 is a functional schematic diagram of an amplifier system. Traditionally, the gain of an operational amplifier is determined by the value of the ratio of a pair of resistors. Specifically, an input resistor is coupled to a negative input of an operational amplifier (Op Amp) and another resistor is placed across the input and output of the Op Amp in a feedback loop. The ratio of the resistive values then determines the gain. Here in the example of FIG. 3, a resistor 304 is coupled the input of an Op Amp 308. A resistor 312 is coupled across the output of Op Amp 308 and to the input node of Op Amp 308 that is also coupled to resistor 304. The gain of the amplifier of FIG. 3, meaning the ratio of the output signal to the input signal, is defined by the ratio of resistor 312 to resistor 304. Typically, to make the gain of the amplifier of FIG. 3 programmable, a variable resistance is coupled to the input of Op Amp 308 so that the ratio of resistor 312 to resistor 304 may be modified. For amplifiers such as that shown in FIG. 3 to be adjustable, the resistance values are varied according to detected peak values from a peak detector.

Figure 4:
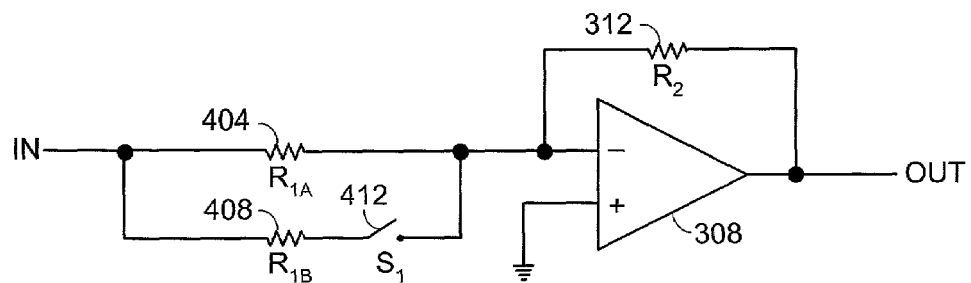
FIG. 4 is an amplifier formed to have programmable gain.

FIG. 4 is an amplifier formed to have programmable gain. Referring now to FIG. 4, it may be seen that Op Amp 308 has resistor 312 coupled from its output to its negative input. Resistor 304, however, is replaced by a resistor 404 that is in parallel with the combination of a resistor 408 and a switch 412. As is understood, the branch including resistor 408 and switch 412 may represent a plurality of such resistor and switch combinations so that the overall resistance on the input side of Op Amp 308 may be modified, thereby modifying the ratio of resistor 312 to the total resistance represented by resistors 404 and 408 of FIG. 4.

The example of FIG. 4 is one that may be implemented with any number of resistors on the input side coupled to a switch, wherein the number of resistors is a function of the number of gain settings that a designer wishes to implement in his or her system. The solution of FIG. 4 has two inherent problems, however. First, resistors formed within integrated circuit devices require a relatively large amount of semiconductor area and, accordingly, are not design efficient. Second, the resistance of the switches is not constant and can vary as much as 20% due to the switches being typically formed by MOSFET devices. Accordingly, because the resistance in any one branch is a function of the MOSFET switch, as well as the resistor which itself may have a 20% fluctuation in resistive value, the gain accuracy can be significantly degraded to a point that the amplifier does not meet design specifications. Because many radio transceiver devices have multiple amplification stages, however, it is important to control the amount of amplification at various stages of the radio transceiver so as to avoid saturation and maintain satisfactory operation. Thus, it is desirable to accurately predict output gain. Ana analog peak detector maybe used with such an amplifier to determine the gain steps.

Figure 5:
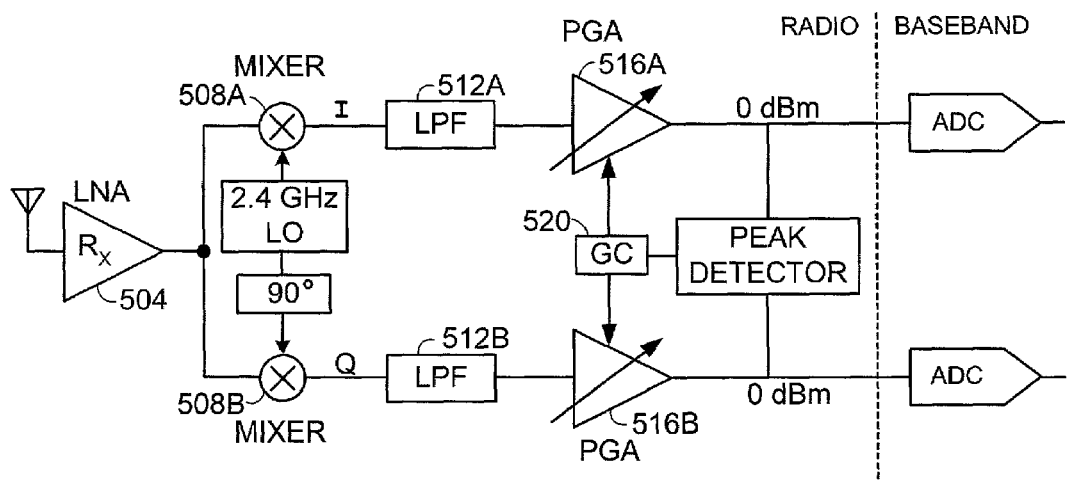
FIG. 5 is a functional schematic block diagram of an RF processing unit of a radio receiver implemented according to one embodiment of the present invention.

FIG. 5 is a functional schematic block diagram of an RF processing unit of a radio transceiver formed according to one embodiment of the present invention. An RF receiver unit initially receives a radio frequency signal at a receiver/low noise amplifier (LNA) 504 that is coupled to receive wireless communications by way of an antenna. As is known by those of average skill in the art, radio communications typically employ one of many different modulation techniques, including Quadrature Phase Shift Keying (QPSK). In the described embodiment, QPSK modulation is utilized. Accordingly, receiver/LNA 504 produces RF with I and Q components for processing. Within each of the branches carrying the I and Q components, the signal is produced to a mixer oscillator that down converts the received signal from radio frequencies to a baseband channel and extracts the I and Q components.

In the described embodiment of the invention, the radio transceiver is formed to satisfy 802.11b design requirements. Accordingly, the input signal is tuned to a 2.4 GHz frequency of oscillation and then is down converted to baseband. Mixers 508A and 508B produce the down converted signal to a low pass filter 512A and a low pass filter 512B for the I and Q modulated channels, respectively.

As is known, low pass filters 512A and 512B are for blocking all communication signals above a specified frequency. The outputs of low pass filters 512A and 512B are then produced to programmable gain amplifiers (PGAs) 516A and 516B. The outputs of PGAs 516A and 516B are adjusted by gain control circuitry 520 to produce approximately 0 dBm of swing for the amplified signal that is then transmitted into baseband processing circuitry. In the described embodiment, the analog-to-digital converters (ADCs) are within the baseband processing circuitry external to the IF radio integrated circuit.

Each of the components in this path thus far, namely, receiver/LNA 504, mixers 508A and 508B, and low pass filters 512A and 512B, add gain to the received signals. Because the power of the received signal can vary dramatically, however, the gain of the programmable gain amplifier is adjusted so that the gain of the output signal being provided to the baseband radio circuitry is of a constant level. Unfortunately, many common programmable gain amplifiers provide a very limited number of amplification steps, if any. Accordingly, the present invention includes a programmable gain amplifier whose gain can be incremented in 3 dB increments from 0 dB to 45 dB. Additionally, the invention includes circuitry to determine an appropriate amount of gain that should be added to the signal received by the PGA 516A so that it is amplified up to 0 dBm with a tolerance of +/−2 dBm.

Figure 6:
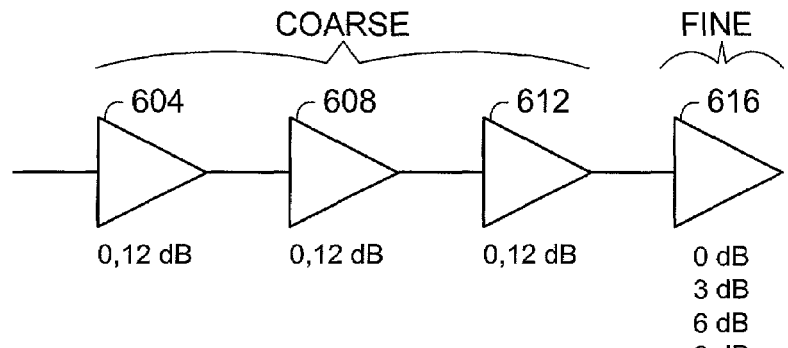
FIG. 6 is a functional schematic diagram illustrating one embodiment of the programmable gain amplifiers used in the present invention.

FIG. 6 is a functional schematic diagram illustrating one embodiment of the programmable gain amplifiers used in the present invention. More specifically, as may be seen, a PGA, for example, PGA 516A of FIG. 5, includes four amplification stages that collectively provide up to 45 dB of gain. An amplifier 604 provides either 0 or 12 dB of gain. Its output is produced to an amplifier 608 that also produces 0 or 12 dB of gain. The output of amplifier 608 is then provided to an amplifier 612 that, again, provides either 0 or 12 dB of gain. The output of amplifier 612 is then provided an amplifier 616 that provides gain in finer increments, namely, 3 dB. Thus, amplifier 616 provides either 0 dB, 3 dB, 6 dB or 9 dB of gain.

Accordingly, by selecting which of the four amplifiers 604, 608, 612 or 616 is providing gain, and in the case of amplifier 616 how much gain is generated therefrom, the amount of gain provided collectively can be varied in incremental steps of 3 dB all the way from 0 dB of gain to 45 dB of gain (16 logic states). In general, each of the amplifiers 604, 608 and 612 receive a binary signal specifying whether it should provide 0 dB of gain or 12 dB of gain. Amplifier 616, however, receives a four-state signal in one embodiment of the invention, which specifies whether it is to provide 0 dB, 3 dB, 6 dB or 9 dB of gain. As is known by those of average skill in the art, four bits is sufficient to generate the required 16 logic states for this embodiment of the invention. A plurality of logic gates may be used to generate the required amplifier control signals from the four bits as generally described.

Figure 7:
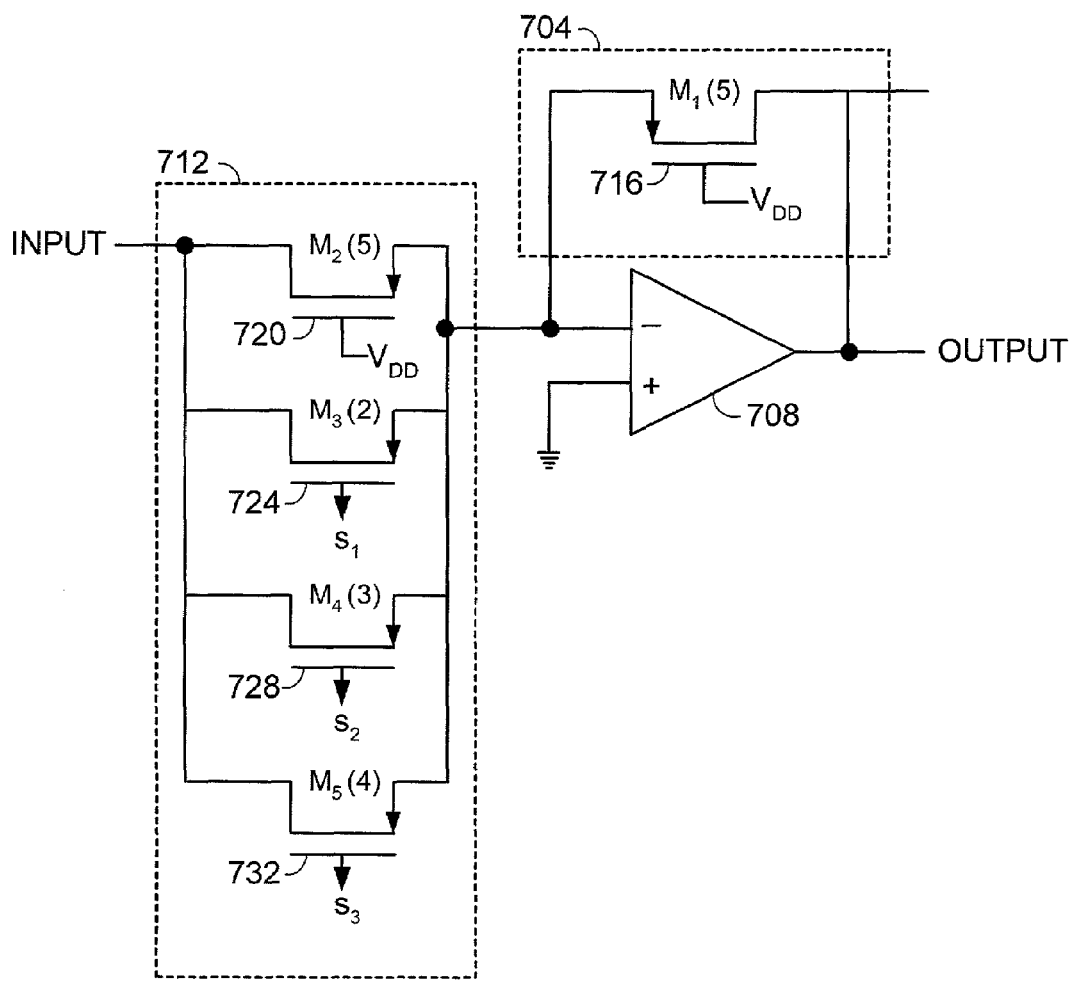
FIG. 7 is a functional schematic diagram of an amplifier that provides gain in 3 dB steps.

FIG. 7 is a functional schematic diagram of an amplifier that provides gain in 3 dB steps. More specifically, the amplifier of FIG. 7 may be used for providing the functionality described in association with amplifier 616 of FIG. 6. As is known by those of average skill in the art, the gain of an operational amplifier is the ratio of the resistance in the feedback loop divided by the resistance at the input stage. Accordingly, the amount of resistance provided by a second group of MOSFETs 712 that are coupled to the input of an Op Amp 708 is divided into the resistance provided by a first plurality of MOSFETs 704 that are coupled in the feedback loop of Op Amp 708.

In the described embodiment, the first group of MOSFETs 704 comprise five matched MOSFETs that are coupled in parallel within the feedback loop of Op Amp 708 and are shown as one MOSFET 716 coupled to operate as a resistor when biased in its linear region.

In the second group of MOSFETs 712, a total of fourteen MOSFETs are coupled in parallel to provide the incremental gain steps for the amplifier of FIG. 7. A first group of five transistors, which is represented by MOSFET 720, is biased to ground and each of the five transistors is always biased in the linear region. The remaining MOSFETs of the second group of MOSFETs 712, however, are selectively biased so as to modify the gain of the amplifier of FIG. 7.

More specifically, two transistors, shown as MOSFET 724, are biased by a first selectable bias voltage $S_1$. Similarly, three transistors, shown as MOSFET 728, are all biased by a second selectable bias voltage $S_2$. Finally, four transistors, represented as MOSFET 732, are biased by a third selectable bias voltage $S_3$. Thus, the five transistors represented by MOSFET 720, will always be on, while the MOSFETs that receive bias voltages $S_1$, $S_2$ and $S_3$, shown herein as MOSFET 724, 728 and 732, respectively, may be selectively biased according to the desired output gain level.

As is understood by those of average skill in the art, the gain of the amplifier (in dB) in FIG. 7 is defined by the equation of 20 log (R2/R1). In this example, R1 comprises the transistors of the second group of MOSFETs 712, and R2 comprises the first group of MOSFETs 704. Because the gain is a function of the logarithm of the resistive values R2/R1, the gain is modified for the amplifier of FIG. 7 to create the 3 dB steps by modifying the resistive ratios according to the biasing of the transistors in the second group of MOSFETs 712.

For example, if MOSFETs 724, 728 and 732 are biased to an off state, then the gain is 0 dB because the log of the resistance of the five MOSFETs 716 divided by the resistance of five matched MOSFETs 720 is equal to 0 because the log of 1 is equal to 0 . To provide 3 dB of gain, seven of the transistors from the second group of MOSFETs 712 must be biased in the linear region. This is because 20 log (7/5) is equal to 2.92 dB, which is approximately equal to 3 dB. Similarly, for 6 dB of gain, ten of the MOSFETs 712 must be biased in the linear region because 20 log (10/5) is equal to 6.02 dB, which is approximately equal to 6 dB. Finally, for 9 dB of gain, all fourteen MOSFETs of the MOSFETs 712 must be biased in the linear region because 20 log (14/5) is equal to 8.94 dB, which is approximately equal to 9 dB.

Thus, to achieve the desired gain steps, the fourteen MOSFETs of the second group of MOSFETs 712, must be operationally biased so that either 5, 7, 10 or 14 transistors are on according to the desired step size. Moreover, as was described before, the five MOSFETs represented by MOSFET 720 are always biased in the linear region by virtue of the gate terminal coupled to ground. Thus, for 0 dB of gain, the remaining transistors are merely biased off by the logic signals. Whenever 3, 6 or 9 dB of output is desired, logic signal $S_1$ is used to operationally bias the MOSFETs represented by MOSFETs 724. Whenever 6 dB of gain is desired, both $S_1$ and $S_2$ are used to bias the transistors represented by MOSFETs 724 and 728 in the linear region. Finally, if all fourteen transistors were to be biased on to provide 9 dB of gain, then $S_1$, $S_2$ and $S_3$ are all set to bias the MOSFETs represented by MOSFETs 724, 728 and 732 of the MOSFETs 712 of FIG. 7.

FIGS. 6 and 7 illustrate the operation of the programmable gain amplifier itself according to one embodiment of the invention. Additionally, however, one aspect of the present embodiment of the invention is the control of the programmable gain amplifier to achieve the desired 3 dB increment steps.

Figure 8:
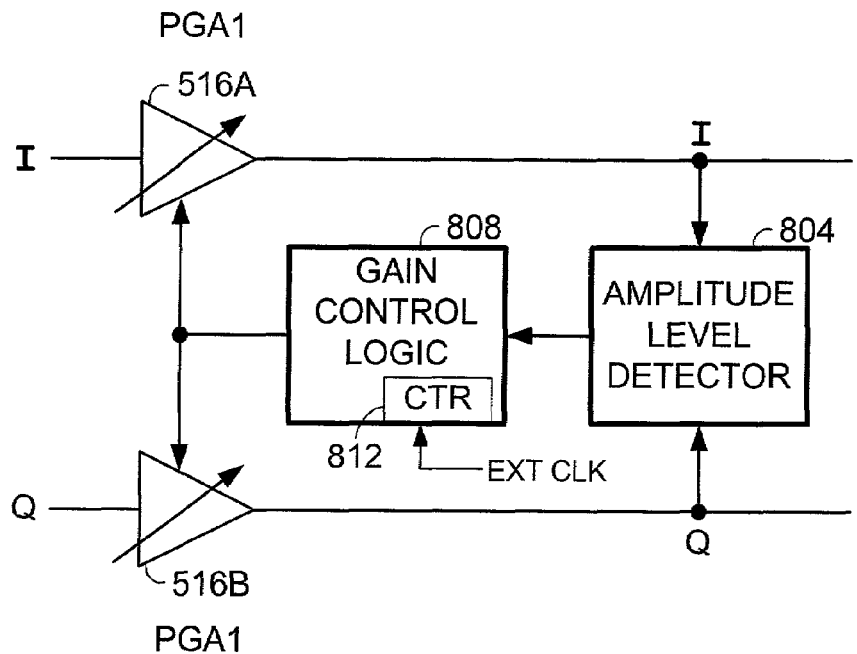
FIG. 8 is a functional block diagram that illustrates one embodiment of the present invention for controlling the programmable gain amplifiers for the I and Q channels.

FIG. 8 is a functional block diagram that illustrates one embodiment of the present invention for controlling the programmable gain amplifiers for the I and Q modulated channels. With respect to the I channel, PGA 516A of FIG. 5 receives the I channel communication signals for amplification. The output of PGA 516A is then provided to an amplitude level detector 804. Similarly, PGA 516B receives the communication signals over the Q channel for amplification and produces an amplified output to an amplitude level detector 804. Amplitude level detector 804 provides an output that may be represented by the square root of the sum of the I channel amplitude squared and the Q channel amplitude squared. This output signal represents a peak level of the I and Q modulated channels.

Amplitude level detector 804 is coupled to receive the output of PGA 516B, as well as PGA 516A, to produce the amplitude peak detection. Based upon the detected gain level of the I and Q modulated channels, amplitude level detector 804 produces an indication to a gain control logic block 808 which responds by generating control commands to PGA 516A and PGA 516B to increment or decrement the output gain level. In the described embodiment of the invention, gain control logic block 808 includes a 4-bit counter 812 that is driven by an external clock signal for producing the increment and decrement control bits to PGAs 516A and 516B.

Figure 9:
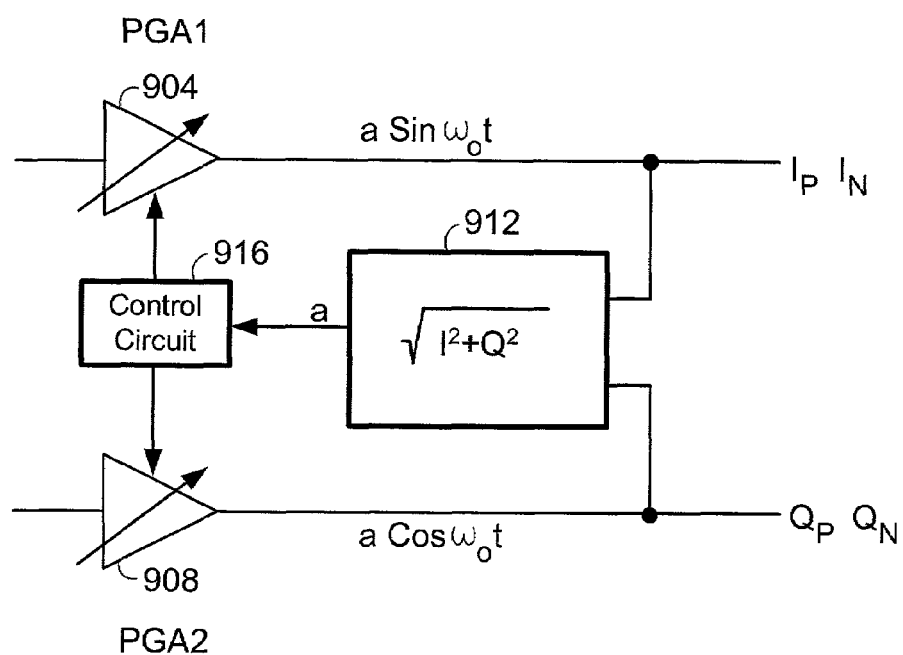
FIG. 9 is a functional schematic block diagram that illustrates an analog peak detector circuit formed according to one embodiment of the present invention.

FIG. 9 is a functional schematic block diagram that illustrates an analog peak detector circuit formed according to one embodiment of the present invention. PGAs 904 and 908 each produce an amplified output signal. The output of PGA 904 is a differential output signal that may be represented by (a)sin ($\omega$t). The output of PGA 908 is a differential output signal that may be represented by (a)cos ($\omega$t). The outputs of PGAs 904 and 908 are fed into a peak detector 912 formed according to the described embodiments of the invention. Responsive to receiving the outputs of PGAs 904 and 908, peak detector 912 determines the peak amplitude of the outputs of PGAs 904 and 908, provides the determined output to a control circuit 916 which then generates control signals back to PGAs 904 and 908 to reduce or increase the output gain therefrom.

In the described embodiment of the present invention, peak detector 912 comprises analog circuitry for fast determination of the peak amplitude of the outputs of the PGAs 904 and 908. In general, peak detector 912 takes advantage of a square law current to voltage function for MOS devices to determine that peak of the amplified signal. By utilizing a circuit that takes advantage of the square law function for MOS devices, the present invention is able to square the received inputs, thereby eliminating the sine and cosine elements of the signals because of the known equation that holds that $\sin^2 + \cos^2 = 1$. Thus, by also taking the square root of the sum of the squared signals, the peak amplitude "a" of the received quadrature signals may be determined.

Figure 10:
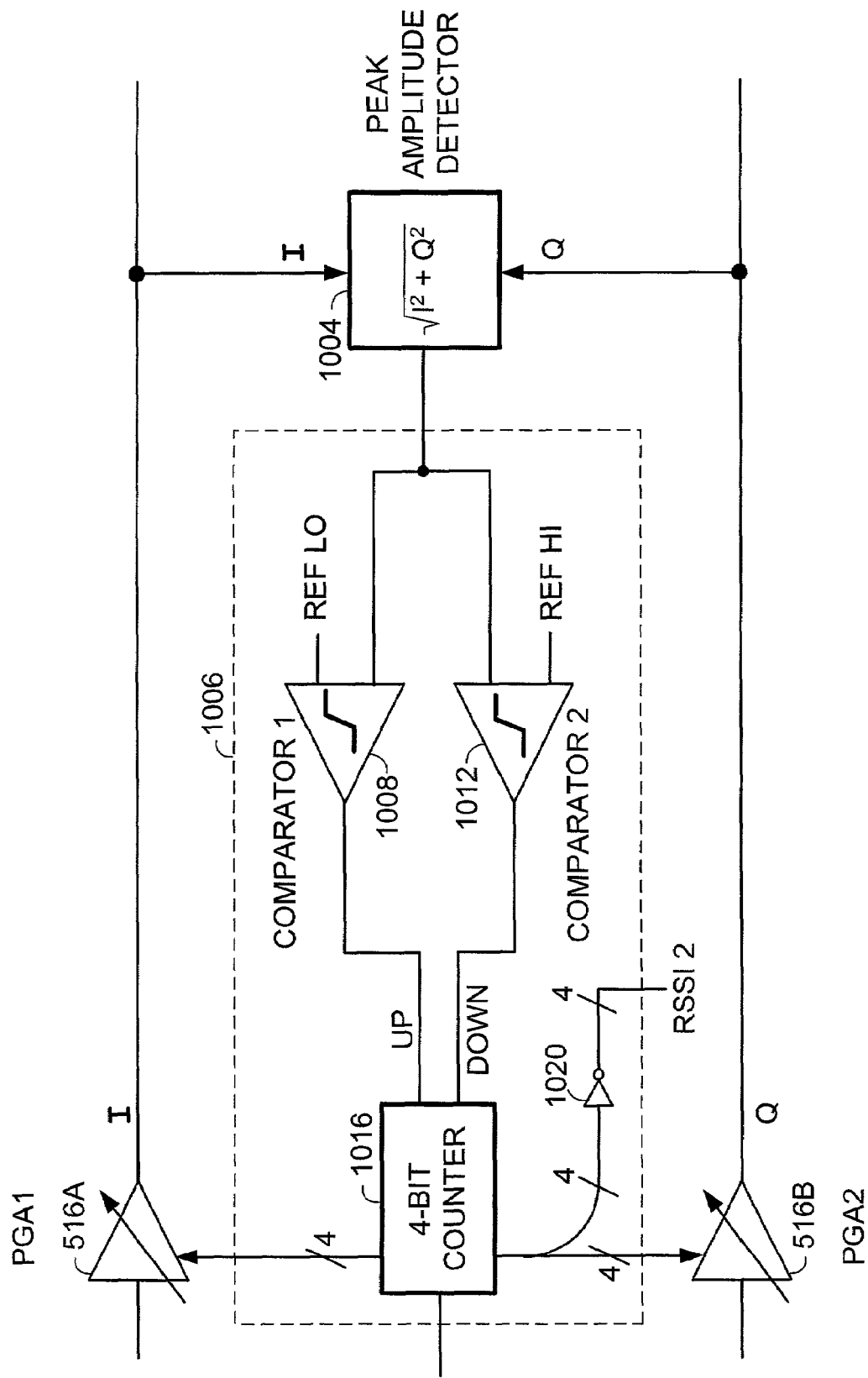
FIG. 10 is a functional schematic block diagram that illustrates one embodiment of the present invention.

FIG. 10 is a functional schematic block diagram that illustrates one embodiment of the present invention. The PGAs 516A and 516B described above, may be seen in the schematic block diagrams of FIG. 8 and FIG. 9. A peak amplitude detector 1004 is coupled to provide an indication of a detected peak amplitude to gain control circuitry 1006. Gain control circuitry 1006 includes a pair of comparators 1008 and 1012. Peak amplitude detector 1004 is coupled to receive the I and Q channel amplified outputs of PGAs 516A and 516B, respectively. Peak amplitude detector 1004 provides an output that represents the square root of the sum of the squared amplitude components of each of the I and Q channels (an overall peak value). The peak value from peak amplitude detector 1004 is provided to comparators 1008 and 1012. Comparator 1008 compares the output of peak amplitude detector 1004 to a low reference voltage value while comparator 1012 compares the output of peak amplitude detector 1004 to a high reference voltage value.

With respect to comparator 1008, if the peak amplitude received from peak amplitude detector 1004 is below the low reference voltage, it generates a signal to 4-bit counter 1016 to increment the 4-bit count value and, thus, increase the gain of PGAs 516A and 516B. Similarly, comparator 1012 will generate a signal to decrease the gain if the detected peak amplitude from peak amplitude detector 1004 is higher than the high reference voltage.

Correspondingly, the gain control circuitry 1006, and, more specifically, the 4-bit counter 1016 generates control signals to PGAs 516A and 516B to increase or decrease the gain. As was described earlier, each of the PGAs 516A and 516B will amplify a signal up to 45 dB in the described embodiment of the invention. 4-bit counter 1016 will set the four control bits to adjust the gain, as has been described herein, in 3 dB increments in the described embodiment of the invention.

The inventor herein has further recognized that the output of 4-bit counter 1016 also describes the inverse of the signal strength for the received signal. Accordingly, by adding an inverter 1020 to the output of 4-bit counter 1016, the output may serve as a received signal strength indicator (RSSI) that is common in these types of radio circuits.

Generally, an RSSI is coupled to the input stage of the programmable gain amplifiers, such as PGAs 516A and 516B, to provide an indication of the received signal strength. The circuitry used to control the gain of PGAs 516A and 516B may also be used to provide an indication of the received signal strength in place of a received signal strength indicator by merely inverting the output of 4-bit counter 812. Accordingly, the output of 4-bit counter 1016 is provided to inverter 1020, whose output serves as the output of a received signal strength indicator.

As is understood by those of average skill in the art, typical radio transceiver designs include two RSSIs so that a determination may be made about the amount of interference as well as the signal strength of the received signal. This information is used for controlling gain at the various stages of the radio transceiver. RSSI 1 (a first RSSI) is usually coupled at the input of a low pass filter to measure the signal strength of the combination of the received signal and interferers in the same and in adjacent channels. RSSI 2 (the second RSSI) is usually coupled at the output of the low pass filters and at the input of the PGA and is used to measure the signal strength of the desired signal. The output of inverter 1020 serves to provide the received signal strength indicator of RSSI 2, meaning the signal strength of the signal only.

Figure 11A:
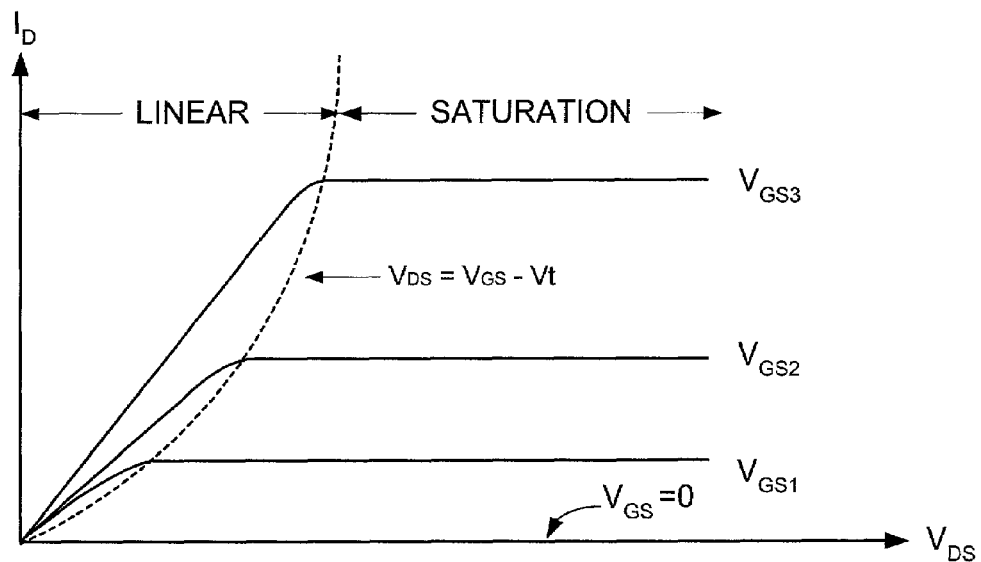
FIGS. 11A and 11B are signal response curves illustrating the operation of a MOSFET when biased properly in the inventive peak detector.
Figure 11B:
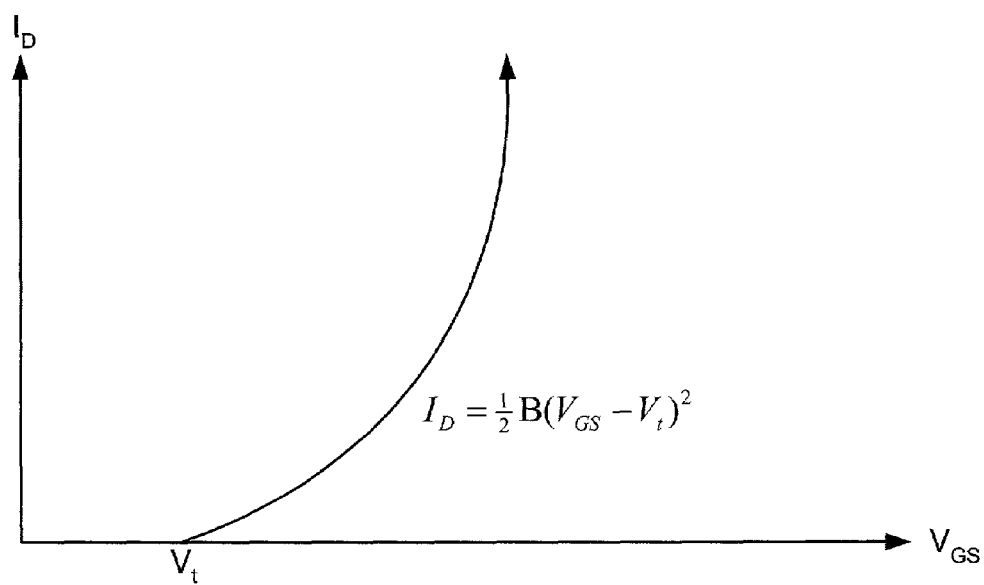

FIGS. 11A and 11B are signal response curves illustrating the operation of a MOSFET when biased properly in the inventive peak detector. Referring first to FIG. 11A, a family of curves represents the relationship between $I_D$ with respect to $V_{DS}$ for increasing levels of $V_{GS}$. As may be seen, for any given $V_{GS} > V_t$, the drain current ID increases approximately linearly with increasing drain to source voltage $V_{DS}$. The name for this region of the response curve is the linear region. Once the drain to source voltage $V_{DS}$ is greater than the gate to source voltage minus the threshold voltage $(V_{GS} - V_t)$, the MOSFET operates in the saturation region in which the drain current $I_D$ is approximately constant for increasing drain to source voltage $V_{DS}$ and is responsive to changes in the gate to source voltage $V_{GS}$. is The actual relationship of the drain current to the gate to source voltage is better seen in FIG. 11B. Thus, as may be seen, $I_D = \frac{1}{2}$ Beta $(V_{GS} - V_t)^2$. Because the threshold voltage $V_t$ and Beta are constants, the current $I_D$ is merely a function of the square of the gate to source voltage $V_{GS}$.

Figure 12:
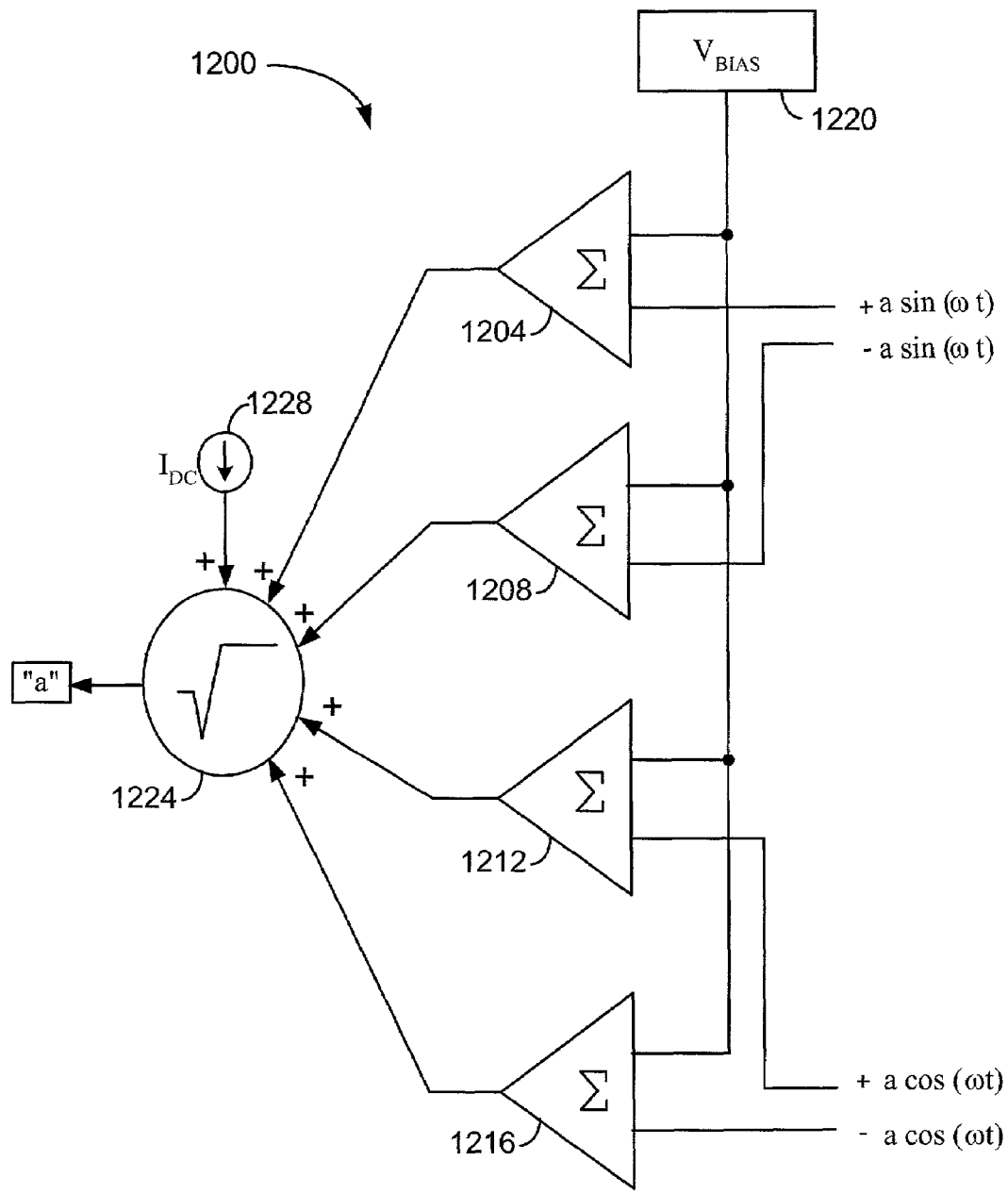
FIG. 12 is a functional block diagram that illustrates a system and method for extracting a peak amplitude of a received signal in one embodiment of the present invention.

FIG. 12 is a functional block diagram that illustrates a system and method for extracting a peak amplitude of a received signal in one embodiment of the present invention. A circuit 1200 receives a differential quadrature signal, represented by (a)sin(107 t) and (a)cos(ωt), where "a" is the peak amplitude of the signal, and wherein the "sin" and "cos" functions represent that the signals are ninety degrees out of phase relative to each other. It is understood that the signals are actually received by way of a wireless transmission in the described embodiment of the invention. The quadrature signals are provided to the first input of transconductance amplifiers 1204 through 1216. A DC bias ($V_{BIAS}$) 1220 is provided to the second input of transconductance amplifiers 1204 through 1216 wherein the resulting voltage is converted to a current that is presented to the input of output device 1224. Output device 1224 further is coupled to receive a constant current $I_{DC}$ from a constant current source 1228.

The received voltage signals are converted to a signal current by transconductance amplifiers 1204 through 1216 after the quadrature input signals are summed with a DC bias voltage ($V_{BIAS}$). In the described embodiment of the invention, the transconductance amplifiers 1204 through 1216 are formed with MOS devices whose current is proportional to the square of the gate to source voltage for the MOS devices within. In effect, therefore, the amplitude components are squared and the sine and cosine components are removed (as will be described in greater detail below in the discussion of FIG. 13). The output of the transconductance amplifiers then is merely a constant Beta times the amplitude squared.

Output device 1224 receives the outputs from each of the transconductance amplifiers and sums them with a constant current received from current source 1228 whose current is formed to be equal to $I_{DC}$ and is for compensating for the bias voltages. The output device 1224 then effectively performs a square root on the sum of its inputs to produce a signal that represents the peak amplitude for the received signals. More specifically, taking advantage again of the current to voltage relationship described above for MOS devices, the output device 1224 converts a plurality of received currents back into a voltage. Thus, the voltage is merely the square root of the sum of the squared current components received from the transconductance amplifiers 1204 through 1216. Thus, the square root of the sum of the squares for each of the outputs from the transconductance amplifiers 1204 through 1216 produces the magnitude "a" for the received quadrature signals. While FIG. 12 is functional in nature, comprehending its operation is helpful in understanding the circuit operation for the circuit of FIG. 13.

Figure 13:
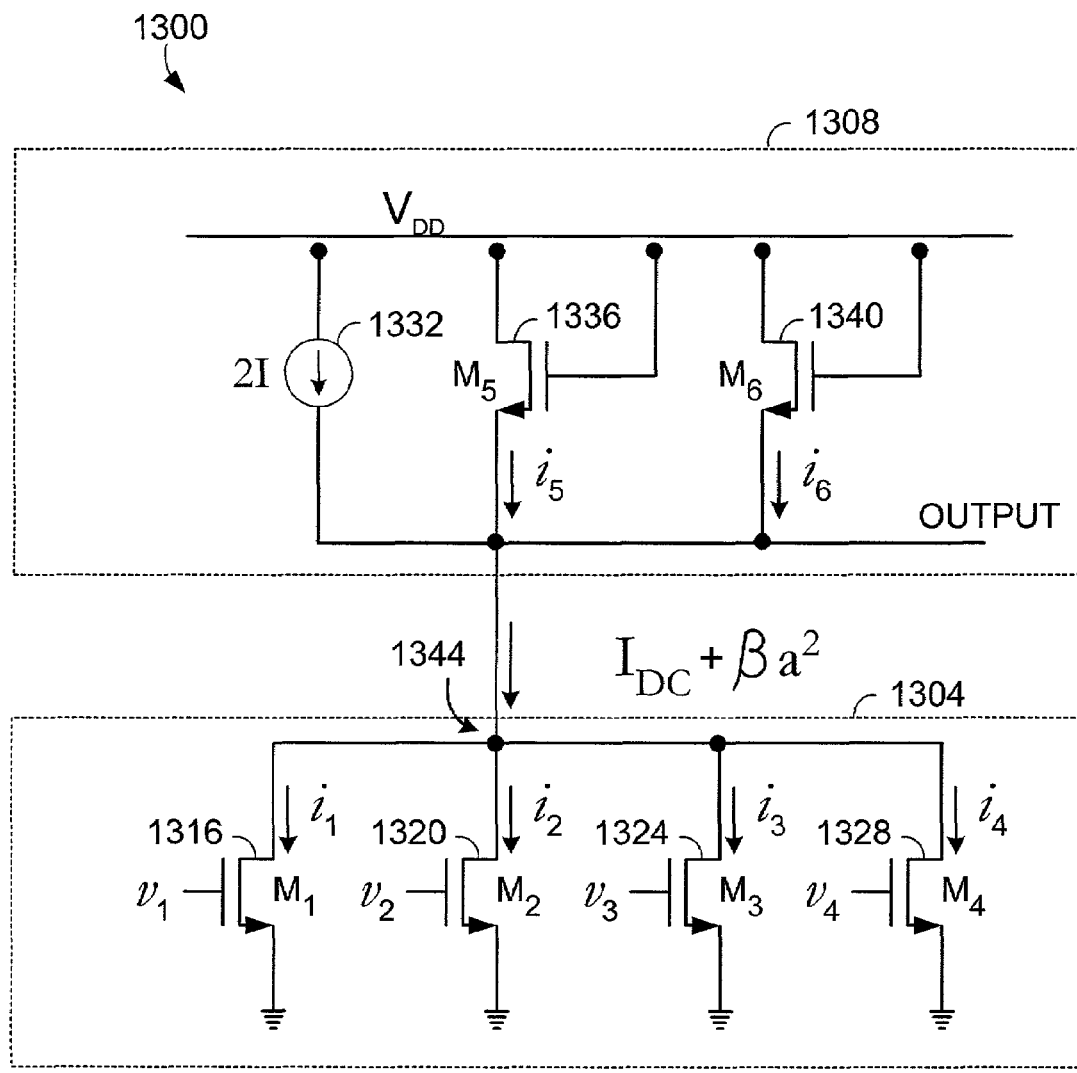
FIG. 13 is a schematic diagram of one embodiment of the present invention.

FIG. 13 is a schematic diagram of one embodiment of the present invention. A circuit shown generally at 1300 comprises a first circuit portion 1304 that is coupled to receive an input from a second circuit portion 1308. The first circuit portion 1304 comprises at least 4 MOSFETs 1316 through 1328 configured to generate a current proportional to a voltage presented to each of the MOSFET gate terminals. Each of the MOSFETs 1316 through 1326 compare to amplifiers 1204 through 1216 of FIG. 12.

The second circuit portion 1308 comprises at least one current source 1332 and at least two MOSFETs 1336 and 1340 wherein the current generated by the second circuit portion 1308 is proportional to the current sinked by the first circuit portion 1304. In the described embodiment of the invention, the first plurality of MOSFETs consists of four MOSFETs. Generally, the number of MOSFETs in first circuit portion 1304 is an even multiple of four since, in the described embodiment, a differential quadrature phase shift keyed signal is being received. Thus, at least four MOSFETs are connected so that the drain terminals are coupled to a first current node 1344 and the source terminals are connected circuit ground. The gate terminals of the first circuit portion 1304 are coupled to receive the differential quadrature signals from a plurality of upstream programmable gain amplifiers (PGAs).

The differential quadrature signals that are received by each of the MOSFETs 1316–1328 of the first circuit portion 1304 effectively are the same signal but are differentiated in phase. Each of the four signals is separated by either 90 degrees or 180 degrees from each of the other three signals received by the other MOSFETs. Thus, MOSFET 1316 is coupled to receive a voltage equal to a DC bias voltage ($V_{BIAS}$) plus (a)sin($\omega t$) where "a" is the peak voltage of the sinusoid signal. MOSFET 1320 is coupled to receive a voltage equal to $V_{BIAS}$ minus (a)sin($\omega t$). MOSFET 1324 is coupled to receive a voltage equal to $V_{BIAS}$ plus (a)cos($\omega t$). MOSFET 1328 is coupled to receive a voltage equal to $V_{BIAS}$ minus (a)cos($\omega t$).

MOSFETs 1316–1328 of the first circuit portion 1304 are biased by the DC bias voltage, provided to the gate terminals, to cause the MOSFETs to operate in the saturation region wherein the drain current is equal to $\frac{1}{2}*\beta(V_{GS}-V_t)^2$. $\beta$ and $V_t$ are device characteristics determined by device geometry and MOSFET design as is known by those of average skill in the art. The drain current is, therefore, a function of the square of the voltage provided or coupled to the gate terminal. The current drawn by MOSFET 1316 in the first circuit portion 1304 is equal to $\frac{1}{2}*\beta(V_{BIAS}+\sin(\omega t)-V_t)^2$. Similarly, the current drawn by MOSFET 1320 in first circuit portion 1304 is equal to $\frac{1}{2}*\beta(V_{BIAS}-\sin(\omega t)-V_t)^2$. As may be seen, the difference between the current drawn by each of the signals is merely a function, at a given moment of the phase of the signal. More specifically, for example, the difference in the current between the first and second MOSFETs 1316 and 1320, respectively, is a function of the difference in the input signals, namely the polarity of sin($\omega t$) (meaning they are 180 degrees out of phase relative to each other).

The current drawn by the third and fourth MOSFETs 1324 and 1328 in the first circuit portion 1304 is equal to $\frac{1}{2}*\beta(V^{BIAS}+\cos(\omega t)-V_t)^2$ and $\frac{1}{2}*\beta(V_{BIAS}-\cos(\omega t)-V_t)^2$, respectively. Once again, the difference in the current between the third and fourth MOSFETs is a function of the difference in the input signals, namely the polarity of cos($\omega t$) (meaning they are 180 degrees out of phase relative to each other). Additionally, because the sine and cosine of a signal merely reflects a ninety-degree difference in phase, the current drawn by the third and fourth MOSFETs is ninety degrees out of phase with the current drawn by the first and third MOSFETs.

The total current is presented at a current node shown generally at 1344 and is equal to the sum of the currents drawn by the first plurality of MOSFETs 1316–1328. By taking advantage of the square law response of MOSFETs in their saturation region and by noting that $\sin^2+\cos^2=1$, the total current drawn by the MOSFETs in the first circuit portion 1304, after completing the squares, is equal to:

$$2*\beta(V_{BIAS}-V_t)^2+\frac{1}{2}*2\beta a^2.$$

The first term is a constant and is equal to 4 times the standard equation for the drain current, i.e., $I^{DRAIN}=\frac{1}{2}*\beta(V_{GS}-V_t)^2$ where the bias voltage has been set, by design, equal to $V_{GS}$. The first term can therefore be represented as a direct current ($I_{DC}$). The second term, $\beta a^2$ is the fluctuating current proportional to the square of the peak voltage of the quadrature inputs.

The second circuit portion 1308 further includes at least one current source 1332 and at least two matched MOSFETs 1336 and 1340. The current source is coupled between a supply voltage $V_{DD}$ and current node 1344 and is formed so the current supplied is equal to twice the current ($I_{DC}$) of any one MOSFET of the MOSFETs 1316–1328 of circuit portion 1304. Additionally, the DC current through each of the MOSFETs 1336 and 1340 is equal to the DC current of any one MOSFET of MOSFETs 1316–1328 of circuit portion 1304. Additionally, the MOSFETs of circuit portion 1308 are coupled in parallel wherein their drain terminals connected to $V_{DD}$. The source terminals of the MOSFETs 1336 and 1340 of circuit portion 1308 are connected to current node 1344. Additionally, the gate terminals of MOSFETs 1336 and 1340 of circuit portion 1308 are coupled to the drain terminals (and to $V_{DD}$).

The total current provided to the output node by the second circuit portion 1308 is equal to the total current drawn by the first circuit portion 1304, namely $I_{DC}+\beta a^2$. Here, $I_{DC}$ is equal to all of the DC current provided by current source 1332 and the DC current that is also conducted through MOSFETs 1336 and 1340. Thus, the current $I_{DC}$ also is equal to 4I if "I" is the DC current through any one of the MOSFETs shown in FIG. 13. It can be seen that the additional (fluctuating) current conducted through the MOSFETs 1336 and 1340 is equal to $\beta a^2$. In the present embodiment of the invention, each of the two MOSFETs 1336 and 1340 will supply one half of the current $\beta a^2$. Moreover, the gate to source voltage ($V_{GS}$) of the MOSFETs 1336 and 1340 is equal to $V_{DD}$-the output voltage ($V_{out}$). The drain current of the MOSFETs 1336 and 1340 is equal to $\frac{1}{2}\beta*(V_{DD}-V_{out}-V_t)^2$. This current is also equal to $\frac{1}{2}\beta a^2$. It can be seen, therefore, that $V_{out}$ is equal to $V_{DD}-V_t-a$, where "a" is the peak amplitude of the received signal. MOSFETs 1336 and 1340 have effectively performed the required square root function.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A radio receiver formed in an integrated circuit, comprising:
    a low noise amplifier (LNA) coupled to receive a radio frequency (RF) signal from an antenna;
    a pair of mixers coupled to receive an output of the LNA, the mixers for down converting the received RF signal to baseband;
    a pair of filters for receiving down converted signals from the mixers;
    logic circuitry for providing gain level control signals;
    at least one programmable gain amplifier (PGA) for providing controlled gain steps according to the gain level control signals received from the logic circuitry; and
    an analog peak detection circuit coupled to receive filtered I and Q baseband signals from the filters having an output voltage characterized by a square root of the sum of the squares of the magnitude of the I and Q components, wherein the analog peak detection circuit further comprises four inputs to receive one of each of four signal components of a quadrature phase shift keyed communication signal.

2. The radio receiver of claim 1 further comprising at least four amplification components, each of the amplification components coupled to one of each of the four signal inputs, the four amplification components for producing a current whose magnitude is a function of the square of the signal magnitude of the signal components.

3. The radio receiver of claim 2 further including output circuitry for generating a constant DC current and a fluctuating current component wherein the DC current and fluctuating current components are equal to the currents generated by the sum of the four amplification components, the output circuitry coupled to the amplification components through a single node.

4. The radio receiver of claim 3 wherein the output circuitry contains two amplifiers for producing an output voltage that is proportional to the fluctuating components.

5. The radio receiver of claim 4 wherein the output voltage is proportional to the magnitude of the I and Q components of the received signal.

6. A radio receiver formed in an integrated circuit, comprising:
    a low noise amplifier (LNA) coupled to receive a radio frequency (RF) signal from an antenna;
    a mixer coupled to receive an output of the LNA, the mixer for down converting the received RF signal to baseband;
    at least one programmable gain amplifier (PGA) for providing controlled gain steps according to received control signals; and
    analog peak detection circuitry whose output voltage further including:
        a first circuit portion for squaring the magnitude of four quadrature signals;
        a second circuit portion coupled to the first circuit portion for summing each of the squared signals and for providing a square root of the current driven by the first circuit portion; and
        logic circuitry coupled to receive a peak voltage component from the analog peak detection circuit, the logic circuitry for generating the control signals to the PGA.

7. The radio receiver of claim 6 wherein the first circuit portion includes at least four matched MOSFETs each coupled in parallel to receive one of the four quadrature signals, the first matched MOSFET receiving a signal characterized by the equation $V_{BIAS}+(a)\sin(\omega t)$.

8. The radio receiver of claim 7 wherein the first circuit portion includes at least four matched MOSFETs each coupled in parallel to receive one of the four quadrature signals, the second matched MOSFET receiving a signal characterized by the equation $V_{BIAS}-(a)\sin(\omega t)$.

9. The radio receiver of claim 8 wherein the first circuit portion includes at least four matched MOSFETs each coupled in parallel to receive one of the four quadrature signals, the third matched MOSFET receiving a signal characterized by the equation $V_{BIAS}+(a)\cos(\omega t)$.

10. The radio receiver of claim 9 wherein the first circuit portion includes at least four matched MOSFETs each coupled in parallel to receive one of the four quadrature signals, the fourth matched MOSFET receiving a signal characterized by the equation $V_{BIAS}-(a)\cos(\omega t)$.

11. The radio receiver of claim 10 wherein the first circuit portion includes a node coupled to the drain of each of the at least four matched MOSFETs, the node further coupled to receive a current from a current source.

12. The radio receiver of claim 11 wherein the drain is further coupled to receive current from at least two matched MOSFETs coupled in parallel, the pair of MOSFETs being coupled in parallel to the current source.

13. The radio receiver of claim 12 wherein the at least two matched MOSFETs each have a gate terminal coupled to $V_{DD}$.

14. The radio receiver of claim 13 wherein the node conducts a current that is equal to $I_{DC}+\text{Bet}(a)^2$.

15. The radio receiver of claim 14 wherein the node is further coupled to the output of the analog peak detection circuitry and provides an output that is equal to $V_{DD}-V_{GS}-a$, wherein, functionally, the output is equal to the square root of the sum of the squares of the magnitude of each of the signal components of the quadrature input signals.

16. A radio receiver, comprising:
    transceiver circuitry for transmitting and receiving communication signals for communicating using phase shift keyed modulation circuitry;
    programmable gain amplifier circuitry for receiving differential phase shift keyed modulation signals from the transceiver circuitry; and
    analog peak detection circuit further comprising:
    a first circuit portion, the first circuit portion further including a first plurality of MOSFETs, each having a gate terminal coupled to receive a differential modulated signal component;
    a second circuit portion, the second circuit portion further including a second plurality of MOSFETs, each having a gate terminal coupled to $V_{DD}$, the second circuit portion further including a current source for providing a specified constant current.

17. The radio receiver of claim 16 wherein the first plurality of MOSFETs comprises a number of MOSFETs that is equal to a multiple of four.

18. The radio receiver of claim 16 wherein the second plurality of MOSFETs comprises a number of MOSFETs for conducting fluctuating signals that is equal to one half of the number of MOSFETs in the first plurality of MOSFETS for conducting fluctuating signals.

19. A method in a radio receiver formed within an integrated circuit for adjusting a gain level of a programmable gain amplifier, comprising:
  receiving a differential modulated signal at each of a first plurality of MOSFETs;
  biasing each of the MOSFETS of the first plurality of MOSFETs into a saturation region;
  producing a current at each of the first plurality of MOSFETs that is equal to a function of the square of the gate to source voltage;
  summing the currents produced by the first plurality of MOSFETs to draw a current;
  producing, in a current source, a constant amount of current into a node coupled to the drains of the first plurality of MOSFETs; and
  producing, in a second plurality of MOSFETs whose gate terminals are coupled to a supply voltage to place the second plurality of MOSFETs in a saturation mode of operation, an amount of current that is equal to a device constant (Beta) times the square of the amplitude of the phase modulated signals received at the gate terminals of the first plurality of MOSFETs.

20. The method of claim 19 further including the step of producing an output voltage at the node that is equal to a peak value of the amplitude of the phase modulated signals received at the first plurality of MOSFETs.

* * * * *